United States Patent
Miyata et al.

(10) Patent No.: US 7,369,074 B2
(45) Date of Patent: May 6, 2008

(54) D/A CONVERTER FOR A DIGITAL SIGNAL AFTER NON-LINEAR A/D CONVERSION, AUDIO SIGNAL PROCESSING CIRCUIT AND LIQUID CRYSTAL DISPLAY DEVICE INCLUDING THE SAME

(75) Inventors: Kazuhiko Miyata, Habikino (JP); Jun Koyama, Sagamihara (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/997,918

(22) Filed: Nov. 29, 2004

(65) Prior Publication Data

US 2005/0128112 A1   Jun. 16, 2005

(30) Foreign Application Priority Data

Dec. 11, 2003   (JP)   ............................. 2003-413156

(51) Int. Cl.
*H03M 1/66*   (2006.01)

(52) U.S. Cl. ....................................... 341/144; 341/138

(58) Field of Classification Search ............... 341/144, 341/154, 138
See application file for complete search history.

(56) References Cited

U.S. PATENT DOCUMENTS

| | | | | |
|---|---|---|---|---|
| 3,997,892 A | * | 12/1976 | Susset ......................... | 341/136 |
| 4,099,174 A | * | 7/1978 | Svensson ..................... | 341/139 |
| 4,126,853 A | * | 11/1978 | Frerking ...................... | 341/138 |
| 4,146,882 A | * | 3/1979 | Hoff et al. ................... | 341/138 |
| 4,160,244 A | * | 7/1979 | Solomon et al. ............. | 341/148 |
| 4,165,507 A | * | 8/1979 | Ong .............................. | 341/138 |
| 4,385,286 A | * | 5/1983 | Haque ......................... | 341/108 |
| 4,396,907 A | * | 8/1983 | Wintzer et al. .............. | 341/127 |
| 4,594,576 A | * | 6/1986 | Fujii ............................ | 341/138 |
| 4,933,675 A | * | 6/1990 | Beard .......................... | 341/110 |
| 4,983,973 A | * | 1/1991 | Lewyn ........................ | 341/138 |
| 5,643,804 A | | 7/1997 | Arai et al. ................... | 438/155 |
| 5,650,834 A | | 7/1997 | Nakagawa et al. ......... | 349/139 |
| 5,708,434 A | | 1/1998 | Hasegawa ................... | 341/148 |

(Continued)

FOREIGN PATENT DOCUMENTS

JP   52-116058   9/1977

(Continued)

OTHER PUBLICATIONS

European Search Report dated Mar. 29, 2006 for Application No. 04028257.6.

*Primary Examiner*—Peguy JeanPierre
(74) *Attorney, Agent, or Firm*—Eric J. Robinson; Robinson Intellectual Property Law Office, P.C.

(57) ABSTRACT

A D/A converter inputted with non-linear conversion digital data such as a digital signal encoded according to a μ-Law system or the like as it is to convert into an analog signal. A D/A converter is of resistor string type, in which a resistance value of each of resistors of a resistor string is not set uniform but weighted so that a non-linear relationship between an encoded input digital signal and an output analog signal is converted into a linear relationship. Consequently, a decode circuit for converting non-linear conversion digital data into linear conversion digital data is not required.

16 Claims, 9 Drawing Sheets

U.S. PATENT DOCUMENTS

| | | | |
|---|---|---|---|
| 5,841,384 A * | 11/1998 | Herman et al. | 341/138 |
| 5,877,533 A | 3/1999 | Arai et al. | 297/350 |
| 5,907,296 A * | 5/1999 | Betts et al. | 341/94 |
| 6,154,121 A * | 11/2000 | Cairns et al. | 341/138 |
| 6,181,265 B1 * | 1/2001 | Lee | 341/145 |
| 6,239,731 B1 * | 5/2001 | Fattaruso et al. | 341/144 |
| 6,295,013 B1 * | 9/2001 | Barna et al. | 341/138 |
| 6,380,876 B1 | 4/2002 | Nagao | 341/154 |
| 6,410,960 B1 | 6/2002 | Arai et al. | 297/347 |
| 6,420,988 B1 | 7/2002 | Azami et al. | 341/144 |
| 6,445,323 B1 * | 9/2002 | Cairns et al. | 341/144 |
| 6,445,325 B1 | 9/2002 | Burns | 341/154 |
| 6,584,078 B1 * | 6/2003 | Betts | 370/276 |
| 6,606,045 B2 | 8/2003 | Azami et al. | 341/144 |
| 6,831,580 B2 | 12/2004 | Bae | |
| 2002/0163457 A1 | 11/2002 | Azami et al. | 341/150 |
| 2003/0112167 A1 | 6/2003 | Bae | 341/154 |

FOREIGN PATENT DOCUMENTS

| | | |
|---|---|---|
| JP | 09-083369 | 3/1997 |
| JP | 2000-341125 | 12/2000 |
| JP | 2003-289251 | 10/2003 |

* cited by examiner

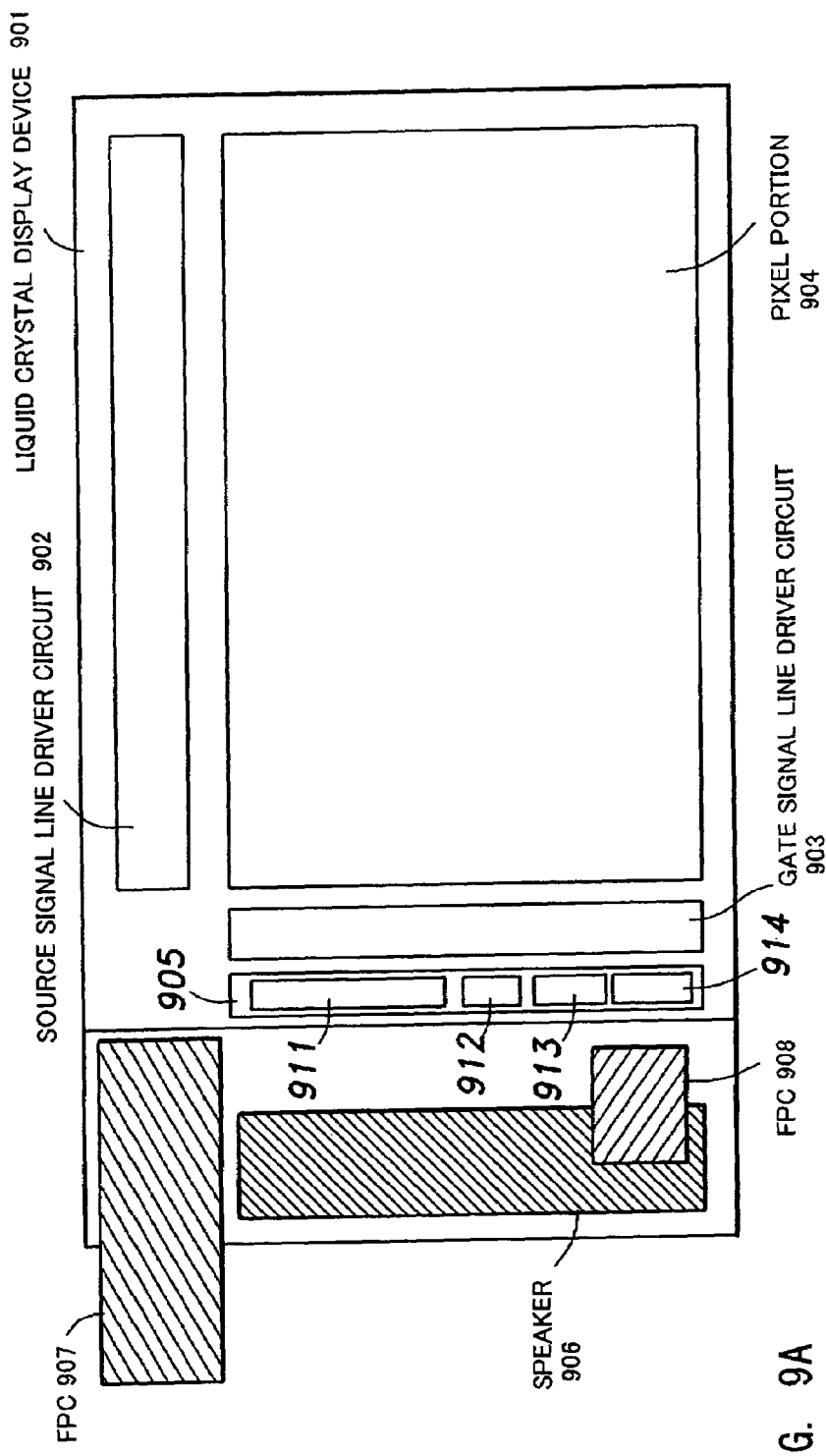
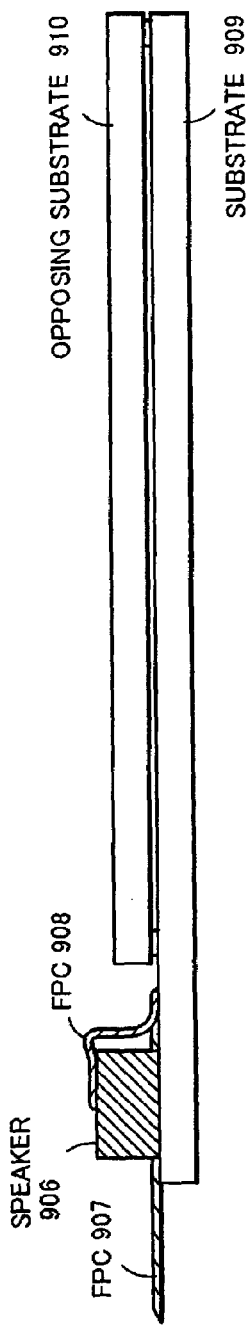
FIG. 9A
FIG. 9B

D/A CONVERTER FOR A DIGITAL SIGNAL AFTER NON-LINEAR A/D CONVERSION, AUDIO SIGNAL PROCESSING CIRCUIT AND LIQUID CRYSTAL DISPLAY DEVICE INCLUDING THE SAME

BACKGROUND OF THE INVENTION

1. Field of the Invention

The present invention relates to a D/A converter (digital/analog converter or DAC). In particular, the invention relates to an audio signal processing circuit having the D/A converter and a liquid crystal display device including the same.

2. Description of the Related Art

In recent years, liquid crystal flat panel displays capable of displaying an image clearly have been widely used and employed as displays for mobile apparatuses such as a mobile phone, a digital camera, a notebook computer, and a PDA (Personal Data Assistant).

Such a semiconductor device having a display function, in many cases, requires an audio circuit for outputting sound in addition to a display portion. Therefore, in conventional display devices, an audio signal processing circuit is generally provided as a dedicated LSI.

As the digital audio technology advances, storage of sound and communication mediums have been more digitalized, and thus a D/A converter for converting digital data into analog data is essential for such mobile apparatuses. As the D/A converter, there is known a D/A converter as shown in FIG. 3 of Patent Document 1, in which an upper limit reference voltage VH and a lower limit reference voltage VL are divided by the capacitance ratio and a divide ratio thereof is changed by changing a combination of capacitors by a switch based on an input digital signal, and a D/A converter as shown in FIG. 1 of Patent Document 2 (referred to as a resistor string D/A converter), in which an upper limit reference voltage VH and a lower limit reference voltage VL are divided by a plurality of resistors connected in series therebetween and a divided potential is outputted by selecting one of connections between the resistors based on an input digital signal by a switch.

[Patent Document 1] Japanese Patent Laid-Open No. 2000-341125

[Patent Document 2] Japanese Patent Laid-Open No. 09-83369

SUMMARY OF THE INVENTION

As mentioned above, in the case where an audio signal processing circuit is formed as a dedicated LSI chip, another printed circuit board is required in addition to a display portion although correct D/A conversion can be realized, which disturbs downsizing and reduction in thickness of a display device.

In addition, in the above-mentioned D/A converter, there is a linear relationship between an input digital signal and an output analog signal. Therefore, in the case where a digital signal after non-linear A/D conversion (non-linear conversion signal) such as a digital signal encoded according to a μ-Law system or an A-Law system is to be returned to an analog signal, the input digital signal is required to be performed a data conversion into a digital signal having a linear relationship with an analog signal (linear conversion signal), that is, decoded before D/A conversion. Thus, a data conversion circuit for converting a non-linear conversion digital signal into a linear conversion digital signal, namely a decode circuit (e.g., Look-Up Table) is necessarily provided before a D/A converter. Consequently, space for providing an audio circuit is increased by the decode circuit, making a chip size larger in the case where an audio signal processing circuit is formed as a dedicated LSI chip. It leads to increase of cost and decrease of yield, and makes difficult to form an audio signal processing circuit and a display portion integrally on the same substrate in order to achieve compactness of a display device such as a mobile apparatus.

The invention is made in view of solving such problems of a conventional technology. The main feature of the invention is to provide a D/A converter to which non-linear conversion digital data such as a digital signal encoded according to a μ-Law system or an A-Law system can be inputted as it is to be converted into an analog signal without a decode circuit, and a semiconductor device including the D/A converter.

In view of the above-mentioned feature, according to the invention, a D/A converter is of a resistor string type, and wherein a resistance value of each of resistors is not set uniform but weighted corresponding to an input signal, namely a digital signal after non-linear A/D conversion.

Specifically, a D/A converter according to the invention comprises a resistor string having a plurality of resistors connected in series between reference voltages and a plurality of switching elements for extracting a potential from respective connections between the plurality of resistors, and wherein the resistors of the resistor string are set at respective resistance values weighted so that a non-linear relationship between an encoded input digital signal and an output analog signal is converted into a linear relationship.

Accordingly, since non-linear conversion digital data can be inputted as it is to be converted into an analog signal, a decode circuit for converting non-linear conversion digital data into linear conversion digital data is not required. Therefore, more compact device employing a D/A converter can be realized and a configuration of the device can be simplified, leading to higher reliability of the device while decreasing manufacturing cost and improving yield.

In the D/A converter described above, digitalized audio data encoded according to a μ-Law system or an A-Law system, for example, can be used as an input digital signal, namely non-linear conversion digital data.

In the D/A converter described above, particularly in the case where an input digital signal is a digitalized n-bit signal (n is an integral numeral of two or more) encoded according to a μ-Law system, assuming that the resistor string has 2n groups of resistors and a reference resistance value is R, such configuration can be made that each of two m-th resistor groups (m is an integral numeral satisfying $1 \leq m \leq n-1$) from both ends connected to the reference voltages includes 2n resistors each having a resistance value of $2^{n-m} \cdot R$, each of the middle two n-th resistor groups from the ends connected to the reference voltages includes 2n−1 resistors each having a resistance value of R, and two connections for extracting a potential are provided between the middle two n-th resistor groups from the ends connected to the reference voltages.

An audio signal processing circuit for supplying an analog audio signal including the D/A converter according to the invention comprises a memory circuit for storing digital audio data, a D/A converter for receiving an encoded digital signal from the memory circuit and then converting into an analog signal, an analog circuit for amplifying and outputting the analog signal received from the D/A converter, and a control circuit for controlling the memory circuit and the D/A converter, wherein the D/A converter comprises a resistor string having a plurality of resistors connected in series between reference voltages and a plurality of switching elements for extracting a potential from respective connections between the plurality of resistors, and the resistors of the resistor string are set at respective resistance values weighted so that a non-linear relationship between an encoded input digital signal and an output analog signal is converted into a linear relationship.

Accordingly, a decode circuit for converting non-linear conversion digital data into linear conversion digital data is not required. Therefore, more compact analog audio signal processing circuit employing a D/A converter can be realized and a configuration of a device can be simplified, leading to increase the reliability of the device while decreasing manufacturing cost and improving yield.

In the audio signal processing circuit described above, the memory circuit can adopt a masked ROM in which digital audio data have been written in advance as a circuit pattern, thereby a step of writing digital audio data into the memory can be omitted. Consequently, a manufacturing step of products of a certain kind can be simplified and cost thereof can be reduced.

In addition, in the audio signal processing circuit, a counter is provided between the control circuit and the memory circuit, thereby data is read out from the memory by increasing or decreasing an address one by one in sequence by the control circuit.

Moreover, the audio signal processing circuit may comprise a level shifter between the D/A converter and the control circuit, and between the memory circuit and the D/A converter, thereby a logic level is converted in transmitting a control signal so that the D/A converter can be driven with high voltage.

A liquid crystal display device including the D/A converter according to the invention comprises a substrate, a pixel portion having thin film transistors formed on the substrate, a driver circuit portion having thin film transistors formed on the substrate and for driving the pixel portion, an opposing substrate provided opposite to the substrate, a sealing member provided between the substrate and the opposing substrate, and liquid crystal filled in the region surrounded by the substrate, the opposing substrate and the sealing member. An audio signal processing circuit for supplying an analog audio signal formed on the substrate is further provided. The audio signal processing circuit comprises a memory circuit for storing digital audio data, a D/A converter for receiving an encoded digital signal from the memory circuit and then converting into an analog signal, an analog circuit for amplifying and outputting the analog signal received from the D/A converter, and a control circuit for controlling the memory circuit and the D/A converter, wherein the D/A converter comprises a resistor string having a plurality of resistors connected in series between reference voltages and a plurality of switching elements for extracting a potential from respective connections between the plurality of resistors, and the resistors of the resistor string are set at respective resistance values weighted so that a non-linear relationship between an encoded input digital signal and an output analog signal is converted into a linear relationship.

Accordingly, a decode circuit for converting non-linear conversion digital data into linear conversion digital data is not required. Therefore, more compact liquid crystal display device including a D/A converter can be realized and a configuration of a device can be simplified, leading to increase the reliability of the device while decreasing manufacturing cost and improving yield.

In addition, the liquid crystal display device described above may comprise a speaker provided on the substrate and connected to the audio signal processing circuit. Accordingly, a compact unit can be configured in which a speaker and a liquid crystal display portion are provided integrally on the same substrate and can be applied to various mobile apparatuses, leading to achieve further lightweight, thinness, and compactness of a device.

As described hereinbefore, according to the invention, a D/A converter can be inputted with non-linear conversion digital data such as a digital signal encoded according to a µ-Law system or an A-Law system as it is to be converted into an analog signal, thereby a decode circuit for converting a non-linear conversion digital signal into a linear conversion digital signal is not required. Consequently, reduction of space and simplification of configuration of an audio signal processing circuit including a D/A converter can be achieved, which realizes a compact semiconductor device including a D/A converter at a low manufacturing cost.

BRIEF DESCRIPTION OF THE DRAWINGS

FIGS. 9A and 9B are a top plan view and a side view respectively, showing an example of a liquid crystal display device including a D/A converter according to the invention.

DETAILED DESCRIPTION OF THE INVENTION

[Embodiment]

Hereinafter, suitable embodiment modes according to the invention are described in detail with reference to the accompanying drawings.

Figure 1:
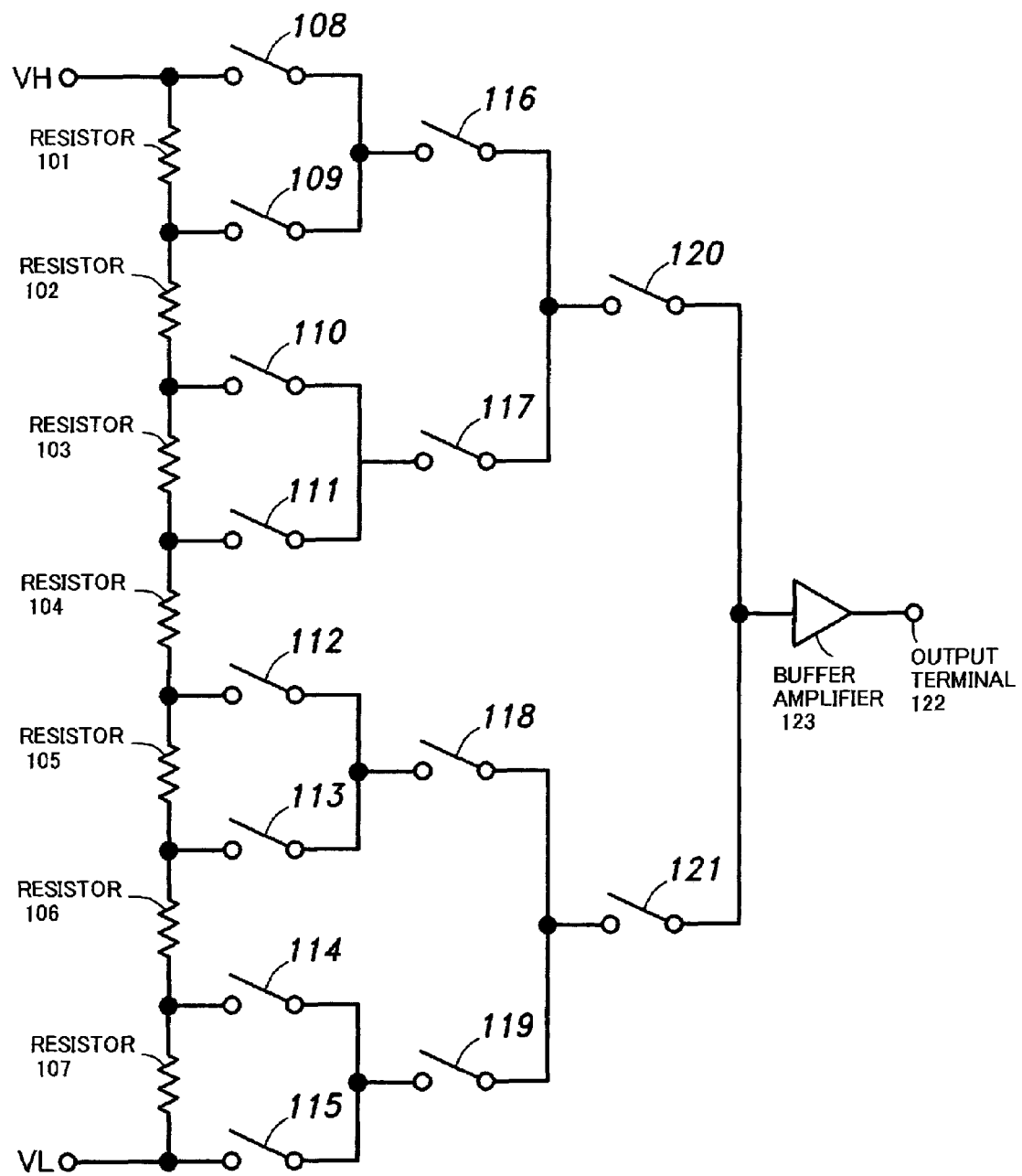
FIG. 1 is a conceptual diagram of a resistor string D/A converter.

According to the invention, a D/A converter is of a resistor string type. FIG. 1 is a conceptual diagram of a general resistor string D/A converter. In the resistor string D/A converter, in the case of input digital data of n-bit (n is an integral numeral of two or more), $2^n$ or $2^n-1$ resistors (unit resistors) are connected in series between an upper limit reference voltage VH and a lower limit reference voltage VL to form a resistor line in a string form (a resistor string). One of connections between the resistors is selected by switch groups for output selection to output a divided potential by the resistors. In the case of FIG. 1, seven resistors 101 to 107 connected between VH and VL constitute a resistor string, one of eight connections between the resistors is selected by controlling each of a first switch group of switches for output selection 108 to 115, a second switch group of switches for output selection 116 to 119, and a third switch group of switches for output selection 120 and 121 based on 3-bit digital data, so that an analog signal divided by the resistors is outputted through a buffer amplifier 123 and an output terminal 122.

In addition, according to the invention, resistance of each of resistors is not set uniform but weighted, thereby a potential is weighted to be divided. Accordingly, in the case where an input digital signal is a digital signal converted non-linearly from an analog signal (non-linear conversion signal) such as a digital signal encoded according to a μ-Law system or an A-Law system, a non-linear relationship between the input digital signal and an output analog signal can be converted into a linear relationship while converting the encoded input digital signal into the analog signal. Therefore, the non-linear conversion digital signal can be directly inputted to a D/A converter without a decode circuit for converting a non-linear conversion digital signal into a linear conversion digital signal.

It is to be noted that the aforementioned μ-Law system and A-Law system are audio data compression technologies for a mobile phone and the like, and the μ-Law system is employed in Japan and US whereas the A-Law system is employed in Europe in practice. For instance, in the μ-Law system, as shown in Table 1 below, an analog input (amplitude) and a digital output do not form a proportionate relationship and a whole analog signal is divided into 16 segments (8 segments in both positive and negative directions, respectively) corresponding to more significant 4 bits of a digital output.

TABLE 1

| Sign Bit | Segment Bit | Step Bit | Sign | Step Side × Number of Steps | Analog Input (Amplitude) |
|---|---|---|---|---|---|
| 1 | 0 0 0 | 0000 | | 2031 + 128 × 16 | 4079 |
| | | 1111 | | 2031 + 128 | 2159 |
| 1 | 0 0 1 | 0000 | | 1007 + 64 × 16 | 2031 |
| | | 1111 | | 1007 + 64 | 1071 |
| 1 | 0 1 0 | 0000 | | 495 + 32 × 16 | 1007 |
| | | 1111 | | 495 + 32 | 527 |
| 1 | 0 1 1 | 0000 | | 239 + 16 × 16 | 495 |
| | | 1111 | | 239 + 16 | 255 |
| 1 | 1 0 0 | 0000 | | 118 + 8 × 16 | 239 |
| | | 1111 | | 111 + 8 | 119 |
| 1 | 1 0 1 | 0000 | | 47 + 4 × 16 | 111 |
| | | 1111 | | 47 + 4 | 52 |
| 1 | 1 1 0 | 0000 | | 15 + 2 × 16 | 47 |
| | | 1111 | | 15 + 2 | 17 |
| 1 | 1 1 1 | 0000 | | 15 | 15 |
| | | 1110 | | 1 | 1 |
| | | 1111 | | 0 | 0 |
| 0 | 1 1 1 | 1111 | — | 0 | 0 |
| | | 1110 | — | 1 | 1 |
| | | 0000 | — | 15 | 15 |
| 0 | 1 1 0 | 1111 | — | 15 + 2 | 17 |
| | | 0000 | — | 15 + 2 × 16 | 98 |
| 0 | 1 0 1 | 1111 | — | 47 + 4 | 104 |
| | | 0000 | — | 47 + 4 × 16 | 111 |
| 0 | 1 0 0 | 1111 | — | 111 + 8 | 119 |
| | | 0000 | — | 111 + 8 × 16 | 239 |
| 0 | 0 1 1 | 1111 | — | 239 + 16 | 255 |
| | | 0000 | — | 239 + 16 × 16 | 495 |
| 0 | 0 1 0 | 1111 | — | 495 + 32 | 527 |
| | | 0000 | — | 495 + 32 × 16 | 1007 |
| 0 | 0 0 1 | 1111 | — | 1007 + 64 | 1071 |
| | | 0000 | — | 1007 + 64 × 16 | 2031 |
| 0 | 0 0 0 | 1111 | — | 2031 + 128 | 2159 |
| | | 0000 | — | 2031 + 128 × 16 | 4079 |

Among the 16 segments of the analog signal amplitude, a segment which is farther than the center 0 is wider in both of the positive and negative directions. Each of the segments is further divided into 16 steps uniformly corresponding to less significant 4 bits of the digital output to quantize an analog input.

Figure 2:
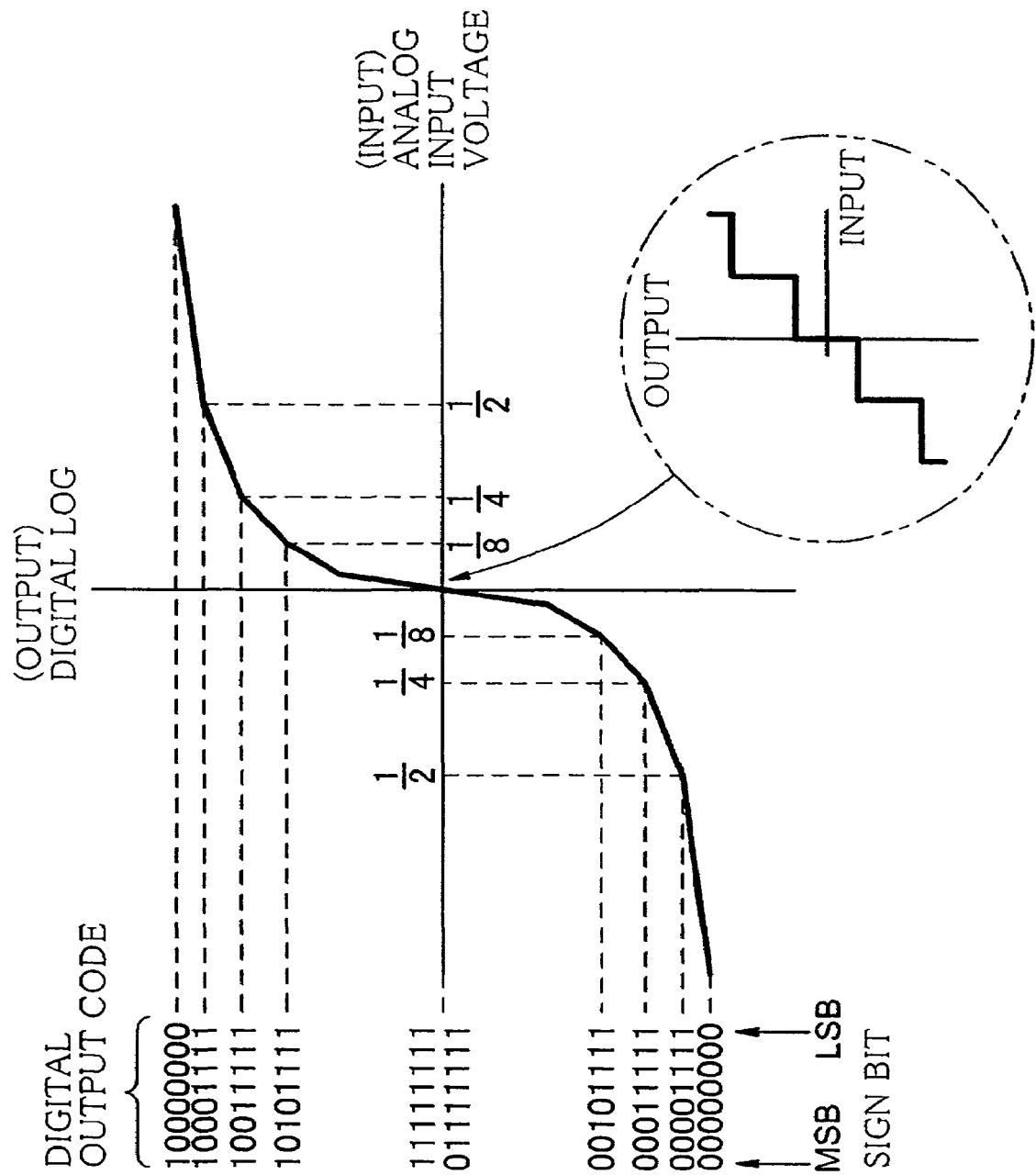
FIG. 2 is a conceptual diagram of a logarithmic compressive conversion of a µ-Law system.
Figure 3:
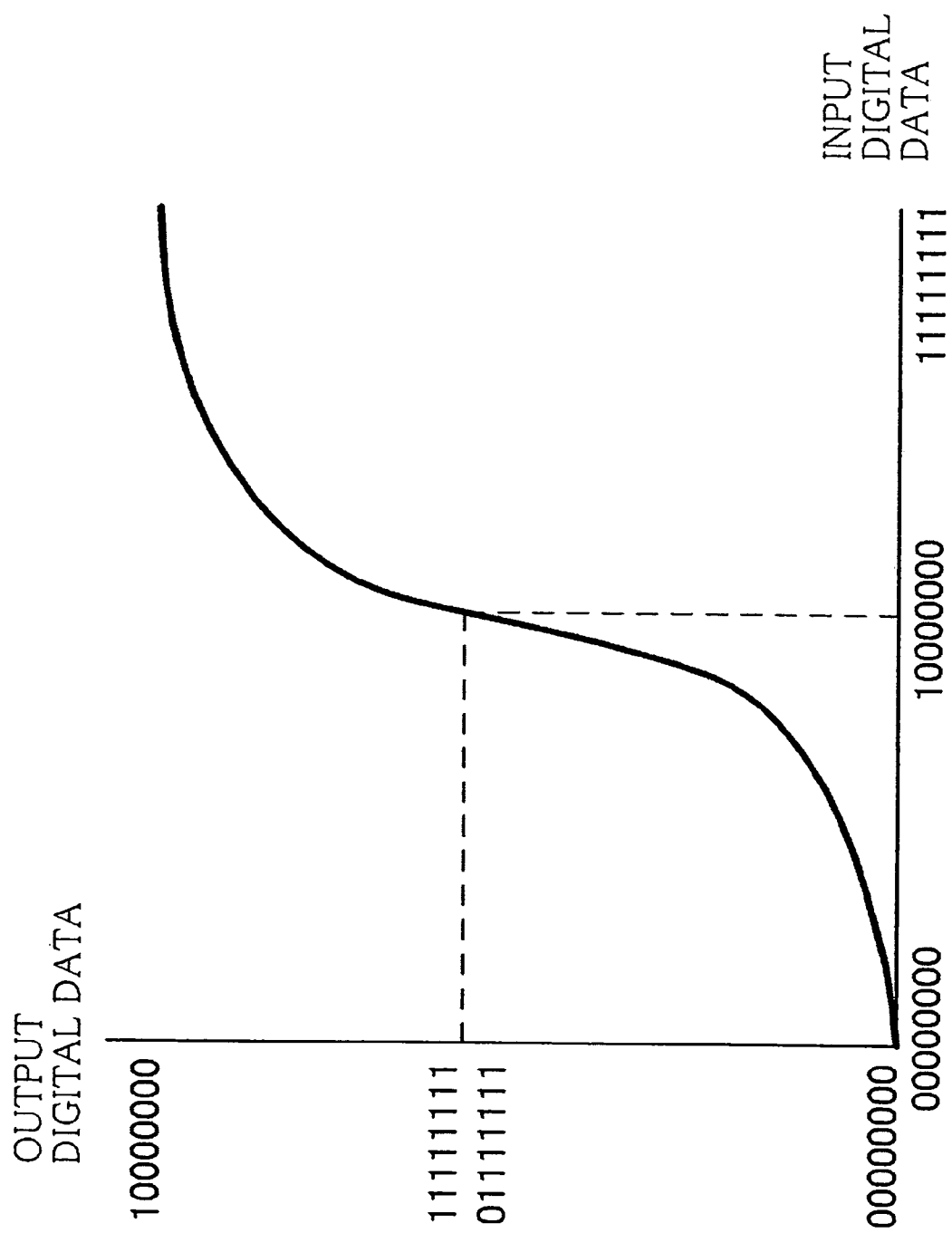
FIG. 3 is a diagram showing a property of a decode circuit for converting non-linear conversion digital data encoded according to a µ-Law system into linear conversion digital data.

FIG. 2 shows a concept of a logarithmic compressive conversion of a μ-Law system. As shown in FIG. 2, a corresponding digital value is taken in smaller steps in a small amplitude of an input signal compared to in a large amplitude of the input signal. Therefore, a Look-Up Table which is a decode circuit for converting non-linear conversion digital data (input digital data) encoded according to the μ-Law system into linear conversion digital data (output digital data) that is used in a conventional technology has a property shown in FIG. 3. The D/A converter according to the invention is provided with the digital data conversion function as shown in FIG. 3 by weighting respective resistance values of resistors in the resistor string D/A converter, thus the decode circuit such as the Look-Up Table is not required.

Figure 4:
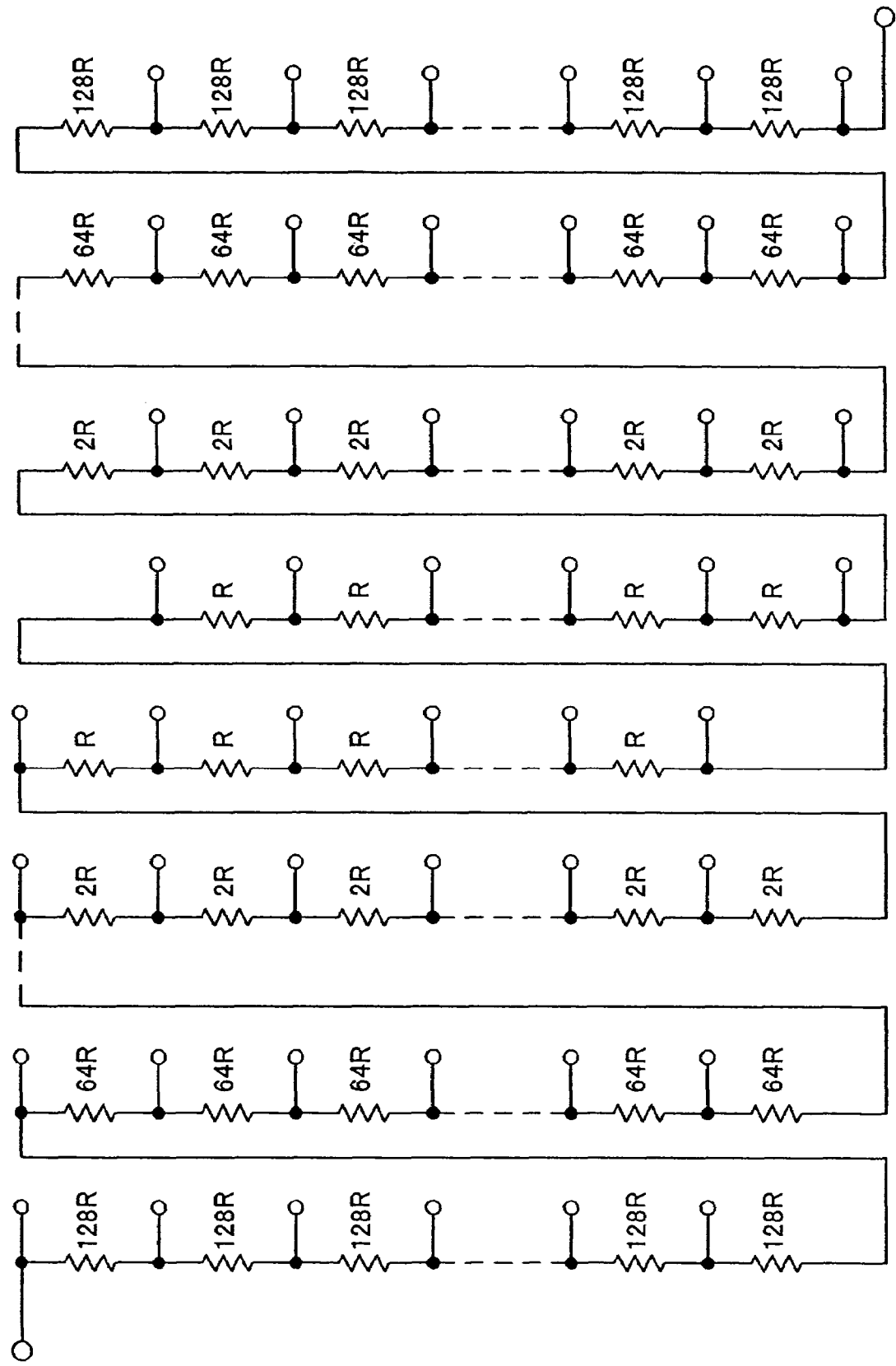
FIG. 4 is a pattern diagram showing a configuration example of a resistor string in a D/A converter according to the invention.

FIG. 4 shows an example of a resister string of a resistor string D/A converter in which respective resistance values of resistors are weighted according to the invention as described above. The resister string shown in FIG. 4 is a configuration example in the case of an 8-bit input signal in μ-Law format, which is weighted so that a non-linear relationship between the 8-bit input digital signal encoded according to the μ-Law system and an output analog signal is converted into a linear relationship. That is, when a reference resistance value is denoted by R, 16 resistors with 128 R, 16 resistors with 64 R, and 16 resistors with 32 R are connected to each of both ends of the resistor string in this order, and a pair of 15 resistors with R are provided in the middle of the resistor string. The respective line of resistors in the middle of the resistor string lacks one resistor because a middle value corresponds to two pieces of digital data in μ-Law format.

Generally, in the case where an input digital signal is a digitalized n-bit signal (n is an integral numeral of two or more) encoded according to a μ-Law system, a resistor string of a D/A converter according to the invention has 2n groups of resistors and wherein each of the two m-th resistor groups (m is an integral numeral satisfying $1 \leq m \leq b-1$) from ends connected to the reference voltages includes 2n resistors each having a resistance value of $2^{n-m} \cdot R$, each of the middle two n-th resistor groups from the ends connected to the reference voltages includes 2n−1 resistors each having a resistance value of R, and two connections for extracting a potential are provided between the middle two n-th resistor groups from the ends.

A configuration of a resistor string as mentioned above, namely a pattern of weighting respective resistors depends on the number of bits of an input digital signal, namely a non-linear characteristic of a relationship between an encoded input digital signal and an output analog signal. For instance, in the case of an input digital signal in A-Law format, another pattern of weighting respective resistors is set.

Figure 5:
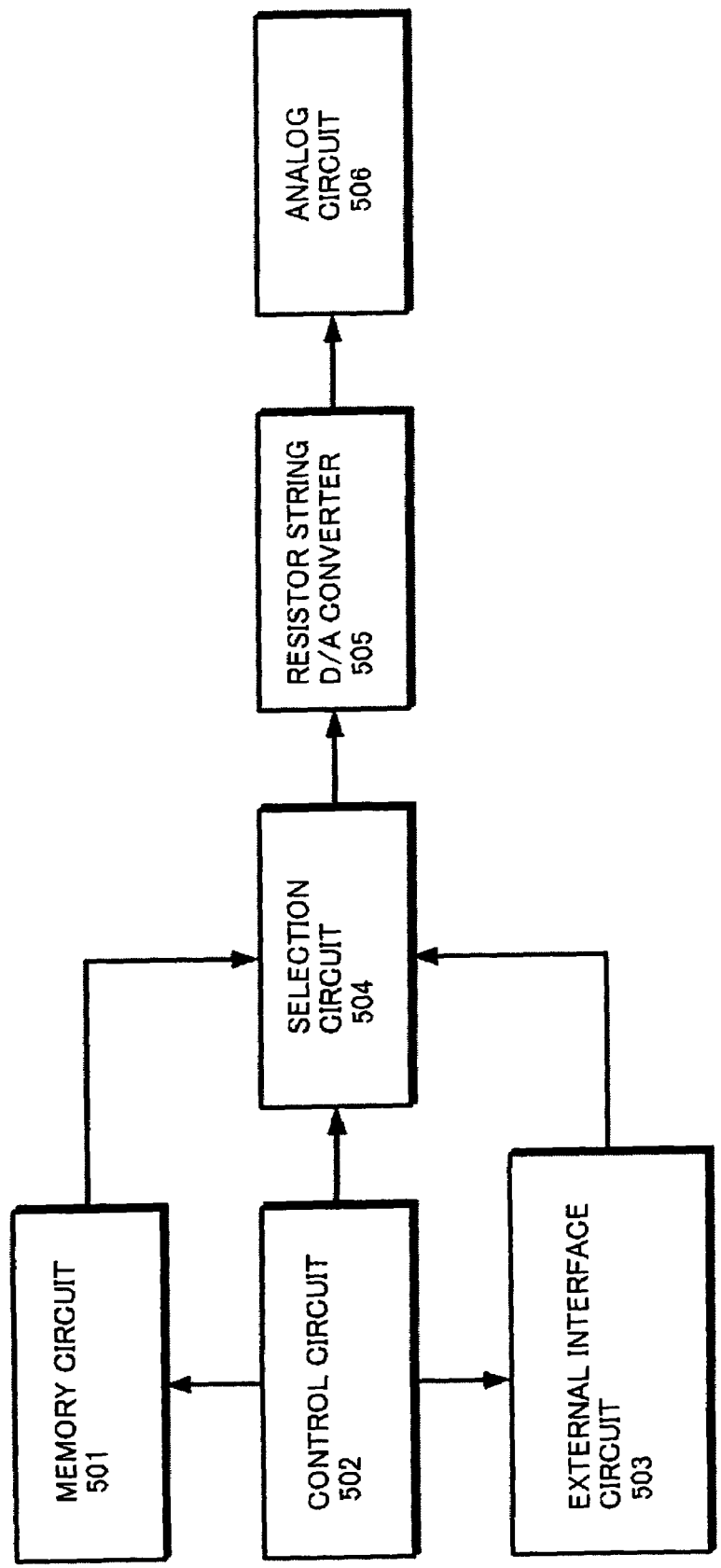
FIG. 5 is a schematic configuration diagram showing an example of audio signal processing circuits employing a resistor string D/A converter according to the invention.

By adopting a resistor string D/A converter including resistors whose resistance values are weighted respectively according to the invention, an audio signal processing circuit as illustrated in FIG. 5 can be configured. In the audio signal processing circuit shown in FIG. 5, either digital data stored in a memory circuit 501 or digital data supplied externally through an external interface circuit 503 is selected by a selection circuit 504 under the control of a control circuit 502, then inputted to a resistor string D/A converter 505 of the invention directly as an input digital signal. The input digital signal is converted into an analog signal in the resistor string D/A converter 505 to be supplied to an analog circuit 506. The resistor string D/A converter 505 according to the invention comprises a resistor string having a plurality of resistors, in which respective resistance values are set such that a non-linear relationship between an encoded input digital signal and an output analog signal is converted into a linear relationship. Accordingly, in view of adopting for an audio circuit of a digital apparatuse and the like, a decode circuit for converting non-linear conversion digital data into linear conversion digital data such as a Look-Up Table with a property as shown in FIG. 3 is not required to be provided before a D/A converter, unlike a conventional audio signal processing circuit. Therefore, as compared to the conventional audio signal processing circuit, an audio signal processing circuit can be configured in a small space, contributing to downsizing of a device. In addition, a circuit configuration can be simplified, leading to lower manufacturing cost and higher yield while higher reliability of a device.

Figure 6:
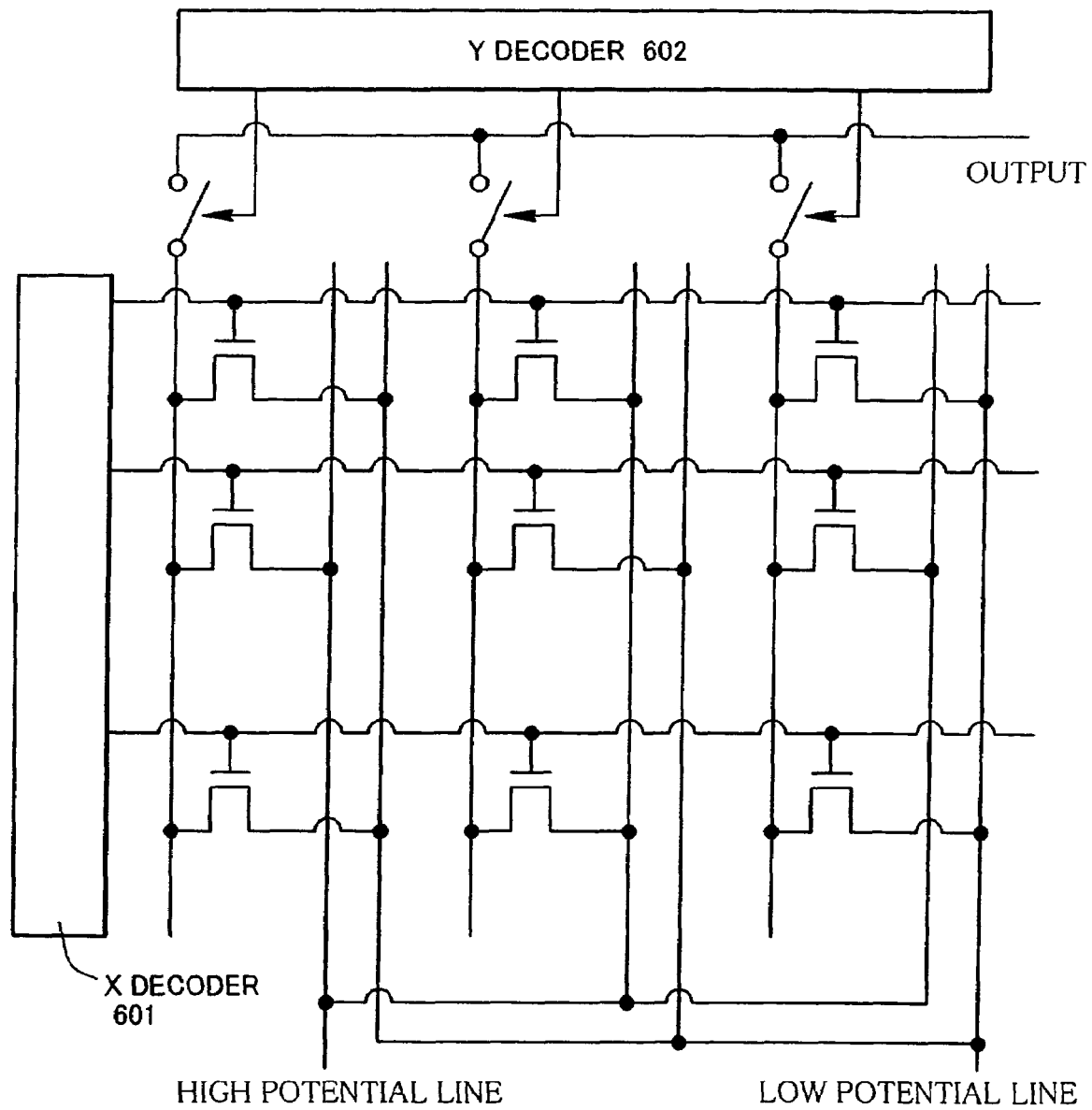
FIG. 6 is a schematic diagram showing a configuration of a masked ROM.

A memory circuit of an audio signal processing circuit as described above can adopt a memory such as an SRAM, a DRAM, and a flash memory, though the invention is not limited to these. Alternatively, a masked ROM that has a configuration including an X decoder 601 and a Y decoder 602 as shown in FIG. 6 and has a circuit pattern of digital audio data which has been written in advance may be adopted.

Figure 7:
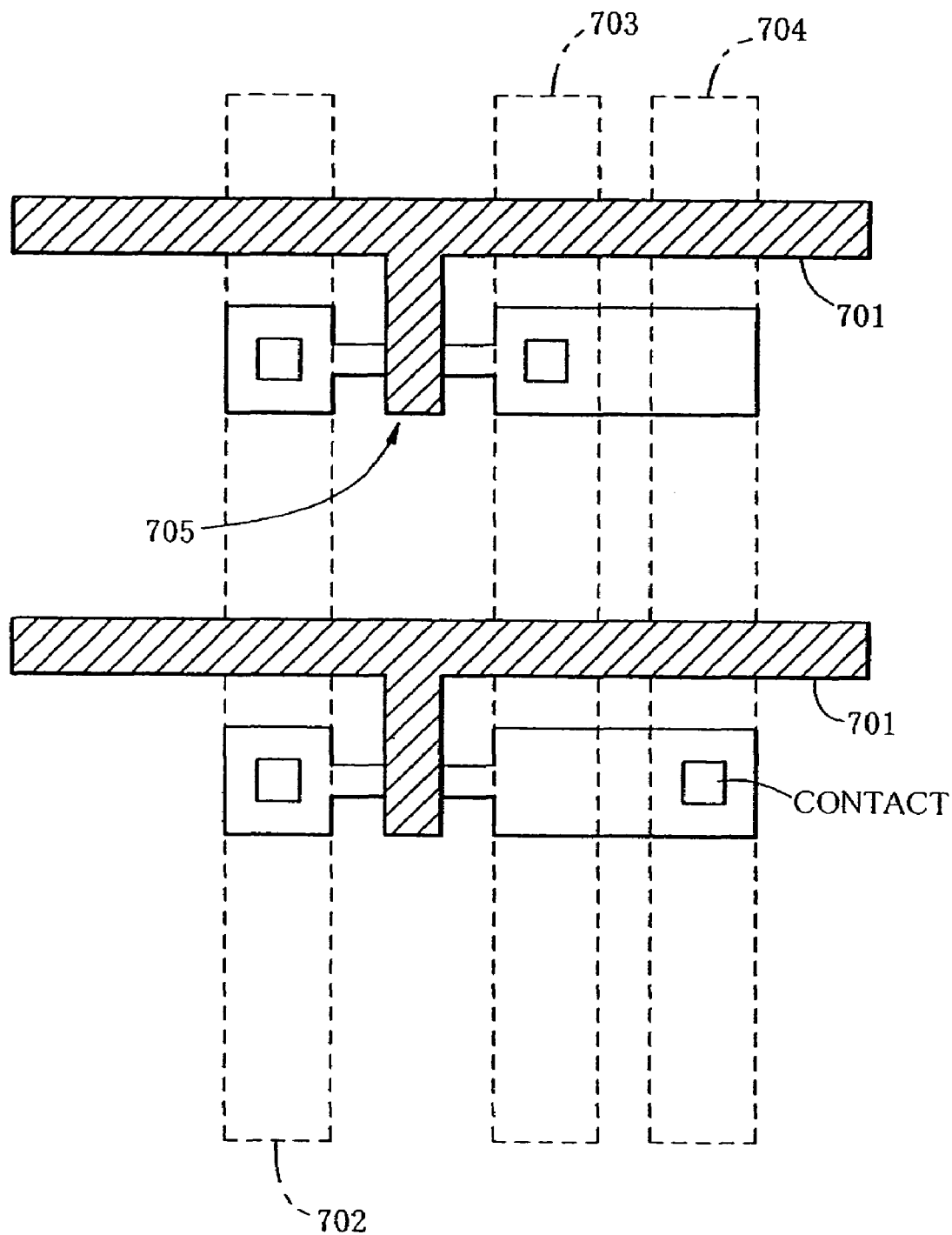
FIG. 7 is a schematic view of a masked ROM cell.

FIG. 7 shows an example of a masked ROM, in which one memory cell comprises a word line 701, a bit line 702, a high potential line 703, a low potential line 704, and a memory transistor 705. In the memory transistor 705, one of a source and a drain is connected to the bit line 702 whereas the other is connected to the high potential line 703 or the low potential line 704. The memory cell is determined whether to become Hi (high potential state) or Low (low potential state) depending on whether on a low potential line side or on a high potential line side a connection between silicon forming the source and the drain and a wiring is provided in the transistor. In FIG. 7, assuming that the memory transistor 705 is an N-channel transistor, when the word line 701 becomes Hi, the bit line 702 is shorted to one of the high potential line 703 and the low potential line 704 through the memory transistor 705 and Hi or Low potential is generated in the bit line 702. This potential is amplified by a sense amplifier and outputted, thereby data can be obtained.

By adopting a masked ROM, a step of writing digital audio data into a memory is omitted. Consequently, a manufacturing step of products of certain kind can be simplified and cost thereof can be reduced.

Figure 8:
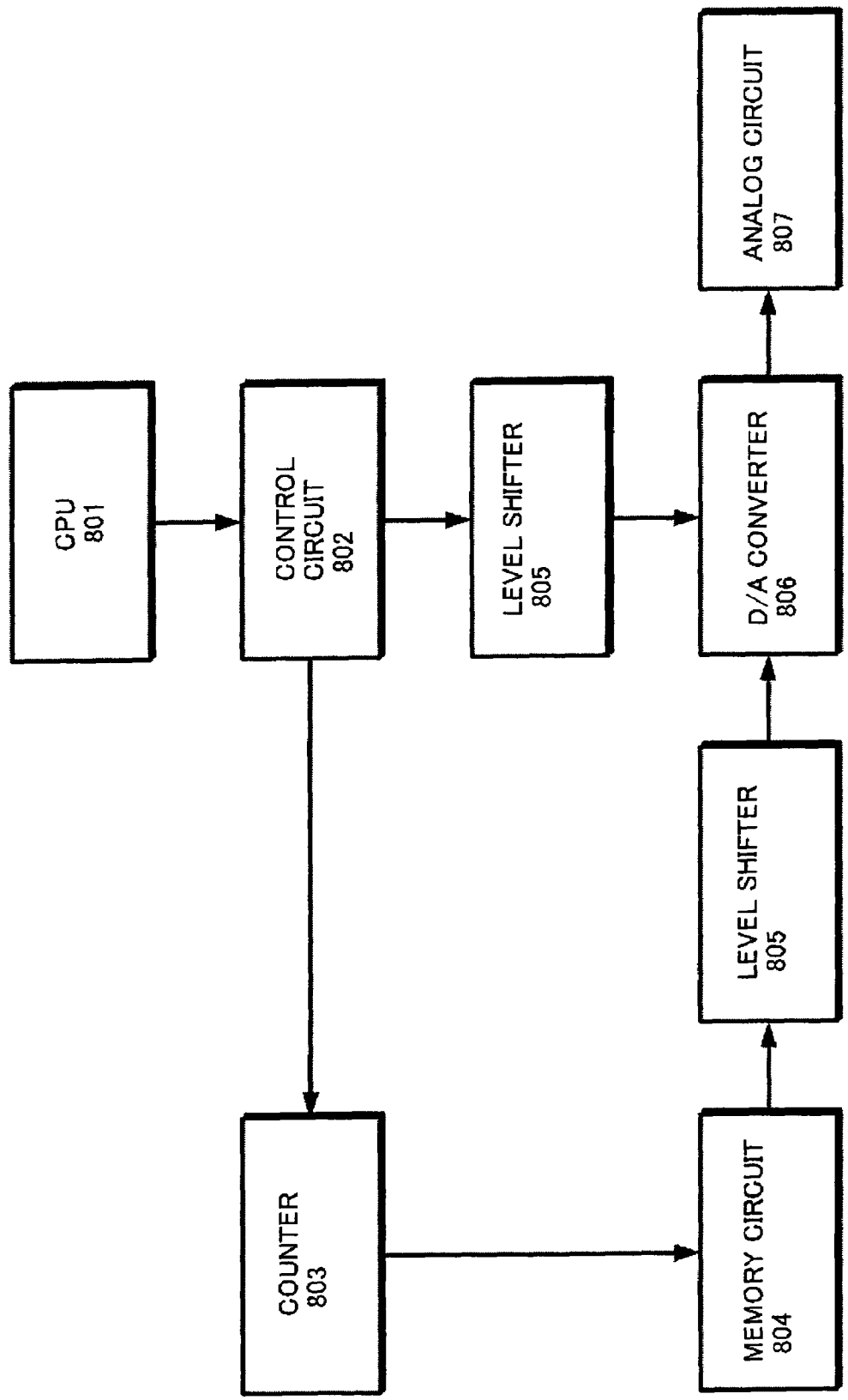
FIG. 8 is a diagram showing a configuration example for a control circuit of an audio signal processing circuit.

FIG. 8 illustrates one example of a control circuit used in the above-described audio signal processing circuit. It can be controlled externally, though can be controlled internally as well by a signal of a CPU 801 which is integrally formed with an audio signal processing circuit as shown in FIG. 8. For controlling a memory circuit 804, a counter 803 may be provided between a control circuit 802 and the memory circuit 804 as shown in FIG. 8, thereby data is read out from the memory circuit 804 by counting addresses in descending order or in ascending order in sequence.

As is also shown in FIG. 8, level shifters 805 for converting a logic level in transmitting a control signal are provided between the control circuit 802 and a D/A converter 806, and between the memory circuit 804 and the D/A converter 806, thereby the D/A converter 806 can be driven with high voltage (e.g., the same voltage as that of a signal line driver circuit). A converted analog signal is supplied to an analog circuit 807.

Configurations of the D/A converter and the audio signal processing circuit according to the invention as described above are also applicable to a semiconductor device in which a D/A converter and an audio signal processing circuit of these kinds can be included. In this specification, the term "semiconductor device" refers to any device that utilizes semiconductor characteristics to function, and electro-optical devices, semiconductor circuits and electronic devices are all included in the semiconductor device. FIGS. 9A and 9B are a top plan view and a side view respectively, showing an example of a liquid crystal display device including a D/A converter according to the invention. In the liquid crystal display device 901, thin film transistors (TFTs) are formed on a substrate 909, and thereby a source signal line driver circuit 902, a gate signal line driver circuit 903, a pixel portion 904, a memory circuit 911, a control circuit 912, a D/A converter 913, and an analog circuit 914 are integrally formed. The source signal line driver circuit 902, the gate signal line driver circuit 903, and the pixel portion 904 constitute a display portion. Signals required for the gate signal line driver circuit 903 are inputted externally from an FPC (flexible printed circuit board) 907. Liquid crystal is filled in the region surrounded by the substrate 909, a sealing member, and an opposing substrate 910 which is provided so as to sandwich the sealing member on the substrate 909. The memory circuit 911, the control circuit 912, the D/A converter 913, and the analog circuit 914 constitute an audio signal processing circuit 905. A speaker 906 mounted on the substrate 909 is connected to the audio signal processing circuit 905 by an FPC 908. Digital audio data is stored in the memory circuit 911 of the audio signal processing circuit 905 and converted into an analog signal in the D/A converter 913, and then the analog signal is outputted as a sound though the analog circuit 914 and the speaker 906. In the case where a resistor string D/A converter according to the invention is provided on the substrate 909, resistors of a resistor string can be made of an impurity diffusion layer or a polysilicon film in a semiconductor thin film, and switches for output selection can be made of thin film transistors.

By adopting a D/A converter according to the invention, a decode circuit for converting a non-linear conversion digital signal into a linear conversion digital signal is not required in the audio signal processing circuit 905, enabling reduction in area of the audio signal processing circuit 905. This space reduction of the audio signal processing circuit 905 realizes a compact unit for providing sound and image at the same time, in which a display portion and an audio output portion are integrally formed on one substrate, such as the liquid crystal display device shown in FIG. 9. The thickness of the opposing substrate 910 and the substrate 909 are in general approximately 0.7 mm respectively in this unit. Therefore, by adopting a speaker of thin type, the maximum thickness of the unit (normally, a speaker portion is the thickest) can result in 2 mm or less. The thickness of a speaker that is provided outside of a substrate is in general approximately 7 mm, therefore, a thin type speaker is provided on the same substrate so that volume occupied by a speaker within a device can be reduced.

In addition, as a decode circuit is not required in the audio signal processing circuit 905, a space thereof can be applied to a larger memory circuit so that a larger amount of data can be stored therein. It is to be noted that, although a liquid crystal material is mainly used for a display portion in a semiconductor device of this type, however, the invention is not exclusively limited to this and any configuration that is known to those skilled in the art can be adopted as long as it has a similar display function.

A D/A converter according to the invention can be inputted with non-linear conversion digital data such as a digital signal encoded according to a μ-Law system or an A-Law system as it is to convert into an analog signal. Consequently, a decode circuit for converting a non-linear conversion digital signal into a linear conversion digital signal is not required and a device can be more compact. Therefore, the D/A converter according to the invention is useful for any semiconductor device including a D/A converter.

This application is based on Japanese Patent Application serial no. 2003-413156 filed in Japan Patent Office on Dec. 11, 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A D/A converter comprising:
a first reference voltage;
a second reference voltage;
a plurality of resistors connected in series between the first reference voltage and the second reference voltage; and
a plurality of switching elements;
wherein the plurality of switching elements are controlled by an input digital data,
wherein the plurality of switching elements extract a potential from selected one of connecting portions between the plurality of resistors,
wherein the input digital data is a non-linear conversion digital signal,
wherein the non-linear conversion digital signal is non-linear with respect to an original analog signal,
wherein the potential is a linear conversion analog signal,
wherein a resistance value of each of the plurality of resistors is set so that the non-linear conversion digital signal is directly converted to the linear conversion analog signal, and
wherein the linear conversion analog signal is linear with respect to the original analog signal.

2. A D/A converter according to claim 1, wherein the input digital data is digitalized data encoded according to a μ-Law system.

3. A D/A converter according to claim 2,
wherein the input digital signal is a digitalized n-bit signal, n is an integral numeral of two or more, encoded according to a μ-Law system,
wherein the plurality of resistors is 2n resistor groups,
wherein a m-th resistor group, m is an integral numeral satisfying $1 \leq m \leq (n-1)$, from the first reference voltage includes 2n resistors each halving resistance value of $2^{n-m} \cdot R$,
wherein a m-th resistor group from the second reference voltage includes 2n resistors each having a resistance value of $(2^{n-m} \cdot R)$,
wherein a n-th resistor groups from the first reference voltage includes $(2n-1)$ resistors each having a resistance value of R,
wherein a n-th resistor groups from the second reference voltage includes $(2n-1)$ resistors each having a resistance value of R, and
wherein two connections for extracting the potential are provided between the n-th resistor groups from the first reference voltage and the n-th resistor groups from the second reference voltage.

4. A D/A converter according to claim 1, wherein the input digital data is digitalized data encoded according to an A-Law system.

5. An audio signal processing circuit comprising:
a memory circuit storing an input digital audio data;
a D/A converter comprising:
a first reference voltage;
a second reference voltage;
a plurality of resistors connected in series between the first reference voltage and the second reference voltage; and
a plurality of switching elements;
an analog circuit connected to the D/A converter; and
a control circuit connected to the memory circuit and the D/A converter;
wherein the plurality of switching elements are controlled by an input digital audio data,
wherein the plurality of switching elements extract a potential from selected one of connecting portions between the plurality of resistors,
wherein the input digital audio data is a non-linear conversion digital signal,
wherein the non-linear conversion digital signal is non-linear with respect to an original analog signal,
wherein the potential is a linear conversion analog signal,
wherein a resistance value of each of the plurality of resistors is set so that the non-linear conversion digital signal is directly converted to the linear conversion analog signal, and
wherein the linear conversion analog signal is linear with respect to the original analog signal.

6. An audio signal processing circuit according to claim 5, wherein the input digital audio data is digitalized data encoded according to a μ-Law system.

7. An audio signal processing circuit according to claim 6,
wherein the input digital audio signal is a digitalized n-bit signal, n is an integral numeral of two or more, encoded according to a μ-Law system,
wherein the plurality of resistors is 2n resistor groups,
wherein a m-th resistor group, m is an integral numeral satisfying $1 \leq m \leq (n-1)$, from the first reference voltage includes 2n resistors each having a resistance value of $2^{n-m} \cdot R$,
wherein a m-th resistor group from the second reference voltage includes 2n resistors each having a resistance value of $(2^{n-m} \cdot R)$,
wherein a n-th resistor groups from the first reference voltage includes $(2n-1)$ resistors each having a resistance value of R,
wherein a n-th resistor groups from the second reference voltage includes $(2n-1)$ resistors each having a resistance value of R, and
wherein two connections for extracting the potential are provided between the n-th resistor groups from the first reference voltage and the n-th resistor groups from the second reference voltage.

8. An audio signal processing circuit according to claim 5, wherein the input digital audio data is digitalized data encoded according to an A-Law system.

9. An audio signal processing circuit according to claim 5, wherein the memory circuit is a masked ROM in which digital audio data has been written in advance as a circuit pattern.

10. An audio signal processing circuit according to claim 5, wherein a counter is provided between the control circuit and the memory circuit, thereby data is read out from the memory by increasing or decreasing an address one by one in sequence by the control circuit.

11. An audio signal processing circuit according to claim 5, wherein a level shifter is provided between the D/A converter and the control circuit, and between the memory circuit and the D/A converter.

12. A liquid crystal display device comprising:
a substrate;
a pixel portion having a first thin film transistor formed over the substrate;
a driver circuit portion having a second thin film transistor formed over the substrate, connected to the pixel portion;
an opposing substrate provided opposite to the substrate;
a sealing member provided between the substrate and the opposing substrate;
liquid crystal provided in a region surrounded by the substrate, the opposing substrate and the sealing member, and
an audio signal processing circuit formed over the substrate comprising:
a memory circuit storing an input digital audio data;
a D/A converter comprising:
a first reference voltage;
a second reference voltage;
a plurality of resistors connected in series between the first reference voltage and the second reference voltage; and
a plurality of switching elements;
an analog circuit connected to the D/A converter; and
a control circuit connected to the memory circuit and the D/A converter;
wherein the plurality of switching elements are controlled by an input digital audio data,
wherein the plurality of switching elements extract a potential from selected one of connecting portions between the plurality of resistors,
wherein the input digital audio data is a non-linear conversion digital signal, and
wherein resistance values of the plurality of resistors are set so that the potential is a linear conversion analog audio signal.

13. A liquid crystal display device according to claim 12, wherein the input digital audio data is digitalized data encoded according to a µ-Law system.

14. A liquid crystal display device according to claim 13,
wherein the input digital audio signal is a digitalized n-bit signal, n is an integral numeral of two or more, encoded according to a µ-Law system,
wherein the plurality of resistors is 2n resistor groups,
wherein a m-th resistor group, m is an integral numeral satisfying $1 \leq m \leq (n-1)$, from the first reference voltage includes 2n resistors each having a resistance value of $2^{n-m} \cdot R$,
wherein a m-th resistor group from the second reference voltage includes 2n resistors each having a resistance value of $(2^{n-m} \cdot R)$,
wherein a n-th resistor groups from the first reference voltage includes (2n−1) resistors each having a resistance value of R,
wherein a n-th resistor groups from the second reference voltage includes (2n−1) resistors each having a resistance value of R, and
wherein two connections for extracting the potential are provided between the n-th resistor groups from the first reference voltage and the n-th resistor groups from the second reference voltage.

15. A liquid crystal display device according to claim 12, wherein the input digital audio data is digitalized data encoded according to an A-Law system.

16. A liquid crystal display device according to claim 12, wherein a speaker is mounted on the substrate and connected to the audio signal processing circuit.

* * * * *

UNITED STATES PATENT AND TRADEMARK OFFICE
CERTIFICATE OF CORRECTION

PATENT NO. : 7,369,074 B2
APPLICATION NO. : 10/997918
DATED : May 6, 2008
INVENTOR(S) : Kazuhiko Miyata et al.

It is certified that error appears in the above-identified patent and that said Letters Patent is hereby corrected as shown below:

On the title of the patent, item (73) Assignee, after "Kanagawa-ken (JP)" insert --; Sharp Kabushiki Kaisha, Osaka-shi (JP)--.

Signed and Sealed this

Eighth Day of December, 2009

David J. Kappos
*Director of the United States Patent and Trademark Office*